United States Patent
Oo

(10) Patent No.: US 8,049,652 B2
(45) Date of Patent: Nov. 1, 2011

(54) REFERENCE PRE-CHARGING FOR TWO-STEP SUBRANGING ADC ARCHITECTURE

(75) Inventor: Kenneth Thet Zin Oo, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 27 days.

(21) Appl. No.: 12/684,760

(22) Filed: Jan. 8, 2010

(65) Prior Publication Data

US 2010/0182183 A1 Jul. 22, 2010

Related U.S. Application Data

(60) Provisional application No. 61/145,840, filed on Jan. 20, 2009.

(51) Int. Cl.
*H03M 1/14* (2006.01)

(52) U.S. Cl. .......................... 341/156; 341/158

(58) Field of Classification Search .................. 341/154, 341/156, 158, 159, 161, 162
See application file for complete search history.

(56) References Cited

U.S. PATENT DOCUMENTS

| | | | |
|---|---|---|---|
| 3,597,761 A * | 8/1971 | Fraschilla et al. ............ 341/156 |
| 4,733,217 A | 3/1988 | Dingwall | |
| 4,999,631 A * | 3/1991 | Sugimoto ...................... 341/156 |
| 5,111,205 A | 5/1992 | Morlon | |
| 5,296,858 A * | 3/1994 | Moyal ............................ 341/156 |
| 5,471,208 A | 11/1995 | Sauer | |
| 5,867,116 A * | 2/1999 | Nakamura et al. ............ 341/159 |
| 6,130,635 A * | 10/2000 | Jones, III ....................... 341/172 |
| 6,570,523 B1 * | 5/2003 | Bacrania et al. .............. 341/155 |
| 6,628,216 B2 * | 9/2003 | Chen et al. ..................... 341/120 |
| 6,956,512 B1 | 10/2005 | San et al. | |
| 7,046,179 B1 | 5/2006 | Taft et al. | |
| 7,119,730 B2 | 10/2006 | San et al. | |
| 7,215,274 B2 * | 5/2007 | Liu ................................ 341/156 |
| 7,321,327 B1 | 1/2008 | San et al. | |
| 7,358,876 B1 | 4/2008 | Oo et al. | |
| 7,978,105 B2 | 7/2011 | Oo et al. | |
| 2009/0102693 A1 * | 4/2009 | Murayama et al. ........... 341/158 |
| 2010/0182178 A1 | 7/2010 | Oo et al. | |

* cited by examiner

*Primary Examiner* — Howard Williams

(57) ABSTRACT

A coarse reference ladder provides a plurality of coarse references. A coarse ADC receives an input voltage. The coarse ADC performs a first comparison of the input voltage and the plurality of coarse references and outputs a coarse output. A switch matrix is configured to close a switch based on the coarse output. An input line corresponding to a coarse reference is coupled to the switch matrix. The input line is precharged to the input voltage. The input line settles from the precharged input voltage to the coarse reference. A fine reference ladder provides a plurality of fine references based on the coarse reference. A fine ADC receives the input voltage and performs a second comparison of the input voltage and the plurality of fine references and outputs a fine output. Logic outputs a digital output for the input voltage based on the coarse output and the fine output.

20 Claims, 11 Drawing Sheets

REFERENCE PRE-CHARGING FOR TWO-STEP SUBRANGING ADC ARCHITECTURE

CROSS REFERENCE TO RELATED APPLICATIONS

The present application claims priority to U.S. Provisional App. No. 61/145,840 for "Analog Digital Conversion Circuitry" filed Jan. 20, 2009, the contents of which is incorporated herein by reference in their entirety.

The present application is related to co-pending U.S. patent application Ser. No. 12/684,773 entitled "Current Sensing and Background Calibration to Match Two Resistor Ladders", filed Jan. 8, 2010, and co-pending U.S. patent application Ser. No. 12/684,735 entitled "Two-Step Subranging ADC Architecture", filed Jan. 8, 2010, the contents of both are incorporated herein in their entirety for all purposes.

BACKGROUND

The present disclosure generally relates to analog-to-digital converters (ADCs) and more specifically to reference pre-charging for ADCs.

Unless otherwise indicated herein, the approaches described in this section are not prior art to the claims in this application and are not admitted to be prior art by inclusion in this section.

A two-step subranging ADC architecture performs an analog-to-digital conversion in two steps. FIG. 1 depicts a conventional two-step subranging ADC architecture 100. Architecture 100 includes a coarse ADC 102 and a fine ADC 104. Coarse ADC 102 includes a coarser or poorer resolution than fine ADC 104 and can quickly determine an approximate subrange that a sample of an input analog signal falls within. This narrows the range of analog voltages in which the sample of the input analog signal may correspond. Fine ADC 104 then further defines the analog voltage from within the subrange selected by coarse ADC 102.

The input analog signal is received at a track-and-hold stage (T/H) 106. Track-and-hold stage 106 tracks the input analog signal and stores an input voltage for the sample of the input analog signal. For example, the input analog signal may be sampled for a half clock cycle and the input voltage from the sample is stored for another half clock cycle.

Coarse ADC 102 compares the stored voltage to a plurality of coarse references received from a reference ladder 108. Reference ladder 108 may include a plurality of tap points. Each tap point may be at a different voltage level for each coarse reference. Coarse ADC 102 performs a first comparison of the input voltage to the coarse references to determine a subrange in which the input voltage falls within.

A result of the first comparison is then used to select finer references or finer subdivisions of the selected subrange for fine ADC 104. For example, certain switches in a switch matrix 110 are closed to provide a second subrange of fine references to fine ADC 104. Fine ADC 104 then performs a second comparison of the fine references and the input voltage.

Encoding and digital correction logic 112 uses the results of the first comparison and the second comparison to determine a first digital code and a second digital code. The first and second digital codes are used to determine a digital output for the sample of the input analog signal. For example, the first and second digital codes may be appropriately weighted, error corrected, and combined to generate the digital output, which may be a digital representation of the sample of the input analog signal.

The determination of the first digital code and second digital code each needs to be made within a half clock period, T/2, where T is a clock period. When the sampling rate goes up, the time that coarse ADC 102 needs to make a decision becomes a larger part of its half clock period T/2.

Reference ladder 108 needs time to settle from a voltage level of a previous sample to set up the fine references. FIG. 2 shows a timing diagram for the conventional two-step subranging architecture 100. At each clock cycle, the input analog signal is tracked (T) and held (H). During the hold period, coarse ADC 1-102 makes its decision within a portion of the T/2 period. Then, in the remaining part of the same T/2 period, coarse output encoding, fine reference selection and subsequent setting of the fine reference takes place. When the sampling rate goes up, coarse output encoding, fine reference selection and subsequent setting of the fine reference combined together take a longer part of the T/2 period, which means less time for reference settling is allotted.

The first digital code from coarse ADC 102 is used to select the switches in switch matrix 110. This reproduces a quantized version of the analog input sample that is used to determine the fine references. For example, the quantized version is the input voltage plus a quantization or rounding error. The output of the switch matrix needs to settle to the voltage of the quantized version. The settling time may become a speed bottleneck as ADC resolution and conversion speed become higher due to large loading from the number of switches and comparators in coarse ADC 102 and fine ADC 104.

FIG. 3 depicts a waveform of a conventional method of precharging using architecture 1-100. At 302, the voltage at the output of switch matrix 1-110 is $V_1$, which is the quantized voltage of the previous sample. At 304, coarse ADC 1-102 is strobed. Then, coarse ADC 1-102 performs the comparison as discussed above. At 306, the switches in switch matrix 1-110 are selected based on the first digital code that was determined. The voltage level needed to set up the fine references is a voltage $V_2$ shown at 308. At 310, a fine reference settling time is needed to move the voltage level from $V_1$ to $V_2$ ($\Delta V$). When the last sample was at a significantly different voltage level as the current sample, a large amount of time is dedicated to fine reference settling to move the voltage from $V_1$ to $V_2$.

SUMMARY

In one embodiment, an analog-to-digital converter (ADC) architecture is provided. A coarse reference ladder provides a plurality of coarse references. A coarse ADC receives an input voltage from a sample of an analog input signal. The coarse ADC performs a first comparison of the input voltage and the plurality of coarse references and outputs a coarse output. A switch matrix includes a plurality of switches and is configured to close a switch based on the coarse output. The switch corresponds to a coarse reference.

An input line corresponding to the coarse reference is coupled to the switch matrix. The input line is precharged to the input voltage. The input line settles from the precharged input voltage to the coarse reference.

A fine reference ladder provides a plurality of fine references based on the coarse reference. A fine ADC receives the input voltage and performs a second comparison of the input voltage and the plurality of fine references and outputs a fine output. Logic outputs a digital output for the analog input voltage based on the coarse output and the fine output.

In one embodiment, an apparatus is provided that comprises: a coarse reference ladder providing a plurality of coarse references; a coarse analog-to-digital converter (ADC) configured to receive an input voltage from a sample of an analog input signal, wherein the coarse ADC is configured to perform a first comparison of the input voltage and the plurality of coarse references and output a coarse output; a switch matrix including a plurality of switches, the switch matrix configured to close a switch based on the coarse output, the switch corresponding to a coarse reference; an input line coupled to the switch matrix, wherein the input line is precharged to the input voltage and then settles from the precharged input voltage to a voltage level of the coarse reference; a fine reference ladder providing a plurality of fine references based on the coarse reference; a fine ADC configured to receive the input voltage and perform a second comparison of the input voltage and the plurality of fine references and output a fine output; and logic configured to output a digital output for the sample of the analog input signal based on the coarse output and the fine output.

In one embodiment, the switch matrix comprises a plurality of switches, the plurality of switches being open for a time period when the coarse ADC is performing the first comparison, wherein the switch is closed when the coarse ADC outputs the coarse output, the time period being when the input line is precharged.

In one embodiment, the apparatus further comprises a precharge switch, the precharge switch being closed for the time period when the coarse ADC is performing the first comparison, wherein the precharge switch is open when the coarse ADC outputs the coarse output, the precharge switch allowing the input line to be precharged.

In one embodiment, the precharge switch when closed couples the input line to the input voltage.

In one embodiment, the apparatus further comprises a plurality of input lines, the plurality of input lines being precharged to the input voltage.

The apparatus of claim 1, further comprising a first track and hold stage configured to track and store the input voltage for the sample of the analog input signal, wherein the input line is precharged from the stored input voltage from the first track and hold stage.

In one embodiment, a method is provided that comprises: providing a plurality of coarse references; receiving an input voltage from a sample of an analog input signal; perform a first comparison of the input voltage and the plurality of coarse references; precharging an input line to the input voltage, wherein the input line then settles from the precharged input voltage to a voltage level of the coarse reference; outputting a coarse output; closing a switch based on the coarse output, the switch corresponding to a coarse reference; providing a plurality of fine references based on the coarse reference; receiving the input voltage; performing a second comparison of the input voltage and the plurality of fine references and outputting a fine output; and outputting a digital output for the sample of the analog input signal based on the coarse output and the fine output.

In one embodiment, the method further comprises tracking and storing the input voltage for the sample of the analog input signal, wherein the input line is precharged from the stored input voltage from the first track and hold stage.

In one embodiment, the method further comprises: providing the plurality of coarse references through a plurality of first taps; and providing the plurality of coarse references through a plurality of second taps, wherein the coarse reference is provided through the precharged input line through a second tap.

In one embodiment, the method further comprises precharging a plurality of input lines to the input voltage.

In one embodiment, the method further comprises closing a second switch to allow the input line to settle from the precharged input voltage to the voltage level of the coarse reference.

The following detailed description and accompanying drawings provide a better understanding of the nature and advantages of the present invention.

DETAILED DESCRIPTION

Described herein are techniques for a reference pre-charging for high-speed two-step subranging ADC architecture. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

An overview of an ADC architecture that uses the precharging is described first. Reference ladder calibration is described and then, the precharging is described. It will be understood that the precharging may be used in other systems.

Overview of ADC Architecture

Figure 4:
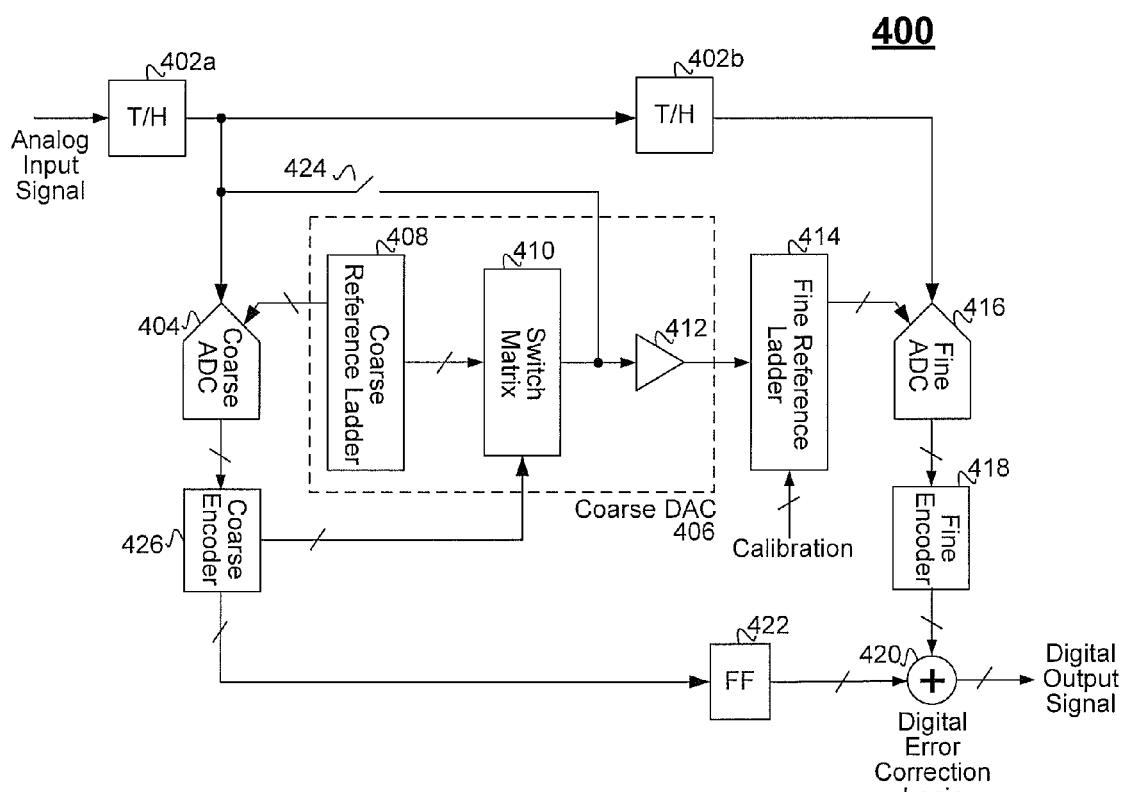
FIG. 4 depicts an analog-to-digital converter architecture according to one embodiment.

FIG. 4 depicts an ADC architecture 400 according to one embodiment. In one embodiment, architecture 400 is used for ultra high-speed, medium-to-high resolution applications. Although these applications are described, architecture 400 may be used in other applications that require an analog-to-digital conversion. In one embodiment, architecture 400 is a two-step subranging ADC architecture.

Architecture 400 converts an analog input signal to a digital output signal. The analog input signal is received at a first track-and-hold stage (T/H) 402a. Track-and-hold stage 402a is configured to track the analog input signal for a part of a clock cycle, T, and store an input voltage for another part of the clock cycle. For example, the analog input signal may be tracked for T/2 and the input voltage is stored for another T/2. The stored input voltage is for a sample of the analog input signal.

A coarse ADC 404 receives the input voltage and performs a comparison of the input voltage to a plurality of coarse references received from a coarse digital-to-analog converter (DAC) 406.

In one embodiment, coarse DAC 406 includes a coarse reference ladder 408, a switch matrix 410, and a buffer 412. Coarse reference ladder 408 is separated from a fine reference ladder 414 through buffer 412. The separation allows for independent optimization of coarse reference ladder 408 and fine reference ladder 414, which will be described in more detail below.

Coarse reference ladder 408 may include a plurality of resistors and a plurality of taps. The plurality of taps provide the plurality of coarse references to coarse ADC 404. The coarse references may be different reference voltage levels.

Figure 5:
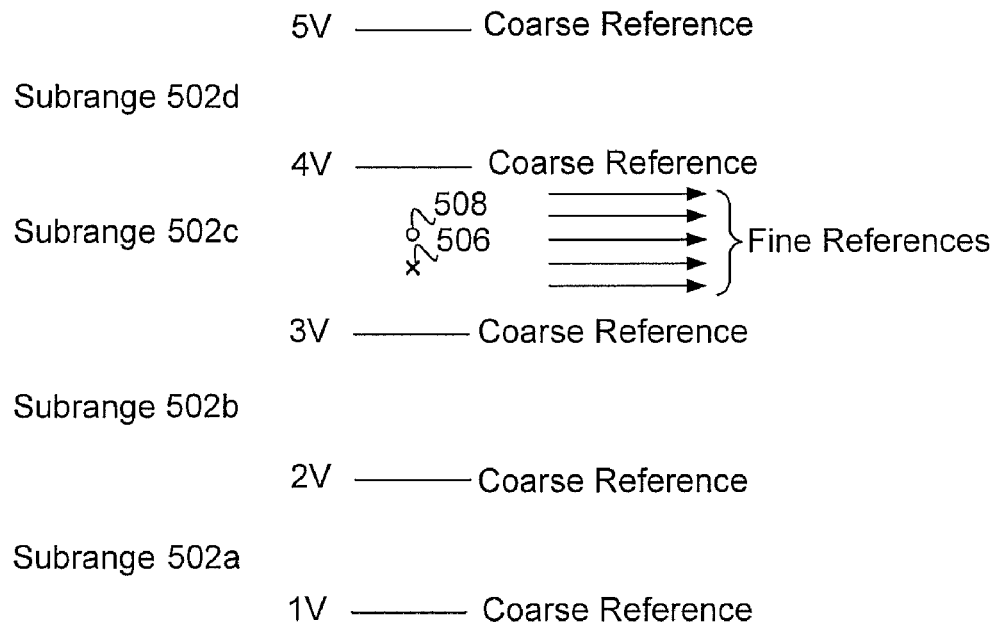
FIG. 5 shows a conceptual example of the subranges according to one embodiment.

Coarse ADC 404 compares the input voltage to the coarse references to determine a coarse decision. The coarse decision may select a coarse reference for a subrange in which the input voltage resides. For example, coarse ADC 404 may choose a midpoint in between a subrange of voltages. FIG. 5 shows a conceptual example of the subranges according to one embodiment. A plurality of subranges 502a-502d are shown and a plurality of coarse references are provided. For example, the coarse references may be 1-5V. Coarse ADC 4-404 compares the input voltage to coarse references and selects which range of values in which the input voltage resides. For example, the input voltage may reside at a point 506 in subrange 502c. Coarse ADC 4-404 then selects subrange 502c. The voltage selected may be midpoint 508 in subrange 502c. By selecting the midpoint, a slight quantization error, $E_q$ is introduced. As will be explained below, the fine references are used to refine the quantization error using the fine references.

Referring back to FIG. 4, the coarse decision is the result of comparisons between the input voltage and the coarse references. For example, comparators in coarse ADC 404 may compare the input voltage with the different coarse references. Each comparator outputs a logic output based upon the comparison. The value of the logic output is based on whether the coarse reference is higher or lower than the input voltage. For example, a comparator may output a value of 0 if the input voltage has a value that is lower than the coarse reference. Also, a comparator outputs a "1" value if the input voltage has a value higher than the coarse reference. A coarse encoder 414 receives the logic output from the comparators and determines a first digital code. The first digital code is a digital representation of the input voltage.

A switch in switch matrix 410 is closed such that a coarse reference for subrange 5-502 selected by coarse ADC 404 is sent to fine reference ladder 414 through buffer 412. Buffer 412 separates coarse reference ladder 408 from fine reference ladder 414.

The coarse reference is sent to fine reference ladder 414. Fine reference ladder 414 uses the coarse reference to generate a plurality of fine references for a fine ADC 416. The plurality of fine references may be within the subrange selected by coarse ADC 404. For example, referring to FIG. 5, a plurality of fine references are provided in between 3V-4V. A fine reference corresponding to the input voltage is then determined.

Fine ADC 416 receives the plurality of fine references and an input voltage from second track-and-hold stage 402b. For example, second track-and-hold stage 402b tracks the input voltage starting at a T/2 period after the tracking period for first track-and-hold stage 402a and stores the input voltage starting at a T/2 period after the storing period for first track-and-hold stage 402a. By using two track-and-hold stages 402a and 402b, the fine ADC decision may be extended an extra T/2 period. This allows an extended settling time for coarse reference ladder 408 and fine reference ladder 414. This concept will be described in more detail below.

Referring back to FIG. 4, fine ADC 416 compares the fine references to the input voltage. In one embodiment, comparators of fine ADC 416 output logic outputs of comparisons of the fine references and the input voltage. For example, a 0 or 1 may be output depending on the comparison. A comparator may output a value of 0 if the input voltage has a value that is lower than the reference. Also, a comparator outputs a "1" value if the input voltage has a value higher than the reference.

A fine encoder 418 receives the logic outputs of the comparison and determines a second digital code. The second digital code is a digital representation of the input voltage.

Digital error correction logic 420 receives the first digital code from coarse encoder 414 and the second digital code from fine encoder 418. The first digital code may be received through a flip-flop 422. Flip-flop 422 may delay the first digital code because of the decision by fine ADC 416 being delayed by a T/2 period.

Digital error correction logic 420 may include an adder. The adder may add the first digital code and the second digital code to produce a digital output. Additionally, digital error correction logic 420 may weight and error correct the first digital code and the second digital code. In one embodiment, the first digital code may be used to determine the most significant bits (MSB) of the digital output. The second digital code may be used to refine the least significant bits (LSB) of the digital output. The digital output may be a binary code or any other type of code that represents the sample of the analog input in the digital domain.

Coarse reference ladder 408 and the use of additional track and hold stages 402a and 402b in architecture 400 will now be described in more detail. The calibration of fine reference ladder 414 and reference precharging will then be described.

Coarse Reference Ladder

Figure 6:
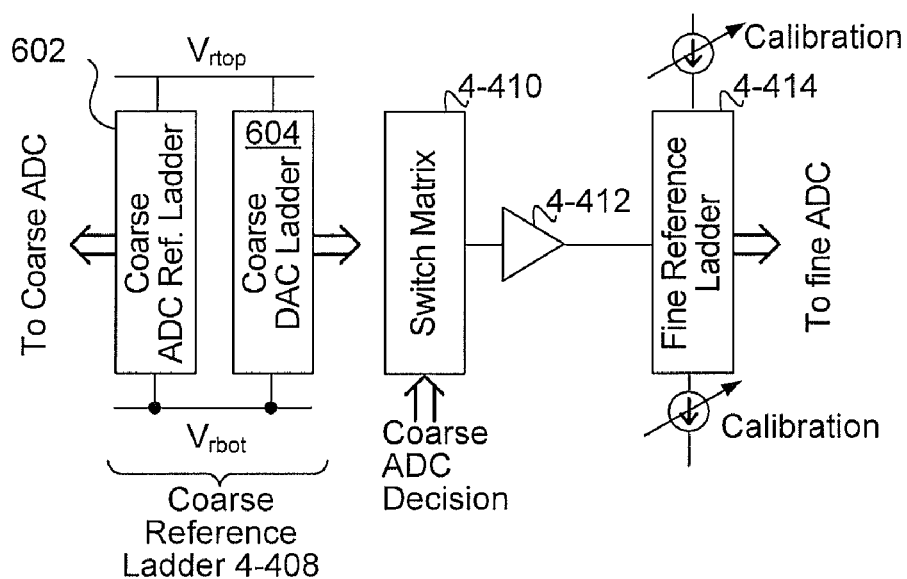
FIG. 6 depicts another example of subranging ADC reference ladders according to one embodiment.

Particular embodiments provide two reference ladders for coarse reference ladder 408. Although two coarse reference ladders are described, any number of coarse reference ladders may be used. FIG. 6 depicts another example of the subranging ADC reference ladders according to one embodiment. Coarse reference ladder 4-408 includes a coarse ADC reference ladder 602 and a coarse DAC ladder 604. By using two separate ladders, coarse DAC ladder 604 may be free of loading from comparators in coarse ADC 4-404. Additional bandwidth may be gained by coarse DAC ladder 608.

In addition to separating coarse reference ladder 4-408 into coarse ADC reference ladder 602 and coarse DAC ladder 604, fine reference ladder 4-414 is separated from coarse reference ladder 4-408 through buffer 4-412. This allows separate implementation and optimization of coarse ADC reference ladder 602, coarse DAC ladder 604, and fine reference ladder 4-414.

Coarse ADC reference ladder 602 is static. Coarse ADC reference ladder 602 provides a number of reference voltages (e.g., the coarse references) between the voltages $V_{rtop}$ and $V_{rbot}$. The reference voltages provided to coarse ADC 4-404 do not change making coarse ADC reference ladder 602 static.

Coarse DAC ladder 604 is dynamic. Each time coarse ADC 4-404 selects a different subrange, a different coarse reference is provided to fine ADC 4-416. By using two separate ladders, coarse DAC ladder 604 can settle faster from a previous voltage level to the voltage level selected as the subrange. For example, coarse DAC ladder 604 is free of loading from comparators in coarse ADC 4-404, which allows coarse DAC ladder 604 to settle faster. Additionally, coarse DAC ladder 604 may be implemented with a low impedance, high speed design in contrast to coarse ADC reference ladder 602, which may be implemented in a high impedance, slow speed design. Coarse ADC reference ladder 602 is static and may not need to be a high speed design. By using a high impedance design, coarse ADC reference ladder 602 consumes less power. However, the high speed design allows coarse DAC ladder 604 to settle faster to set up the fine references based on the subrange selected by coarse ADC 4-404.

Coarse DAC ladder 604 is also separated from fine reference ladder 4-414 by buffer 4-412. The use of buffer 4-412 instead of coarse DAC ladder 604 to drive fine reference ladder 4-414 prevents a large loading from fine ADC 4-416 on coarse DAC ladder 604. For example, loading from the comparators found in fine ADC 4-416 is prevented. This improves settling speed and slew rate of coarse DAC ladder 604.

Fine reference ladder 4-414 is dynamic because different fine references are being selected based on the subrange selected by coarse ADC 4-404. When different subranges are selected, the fine references are at different voltage levels and this causes shifts in voltage at fine reference ladder 4-414. However, because fine reference ladder 4-414 is separated from coarse DAC ladder 604 by buffer 4-412, coarse DAC ladder 604 is not disturbed by the change in voltage levels at fine reference ladder 4-414.

Fine reference ladder 4-414 may also be floating in that there may not need to be a fixed resistance ratio between fine reference segments and coarse reference segments. A reference segment may be a unit resistor between taps of coarse reference ladder 4-408 or fine reference ladder 4-414. Coarse reference ladder 4-408 or fine reference ladder 4-414 may each include multiple unit resistors that divide the ladder into the different voltage subranges. The unit resistors of floating fine reference segments may be implemented in different orientations and sizes from coarse reference ladder 4-408. Calibration is used to match unit resistors of fine reference ladder 4-414 to coarse reference ladder 4-408, which will be described below. Conventionally, a fixed resistance ratio between coarse reference ladder 4-408 and fine reference ladder 4-414 lead to ultra low resistance segments in a high-speed design if coarse reference ladder 4-408 uses low resistance segments. The very low resistance values may lead to parasitic effects. Also, physical implementation of low resistance segments may require large areas and have other process parasitics (e.g., interface and contacts resistance). Using floating fine references avoids these problems as low impedance resistors may be used but very small resistor segments can be avoided.

Fine reference ladder 4-408 may be floating, but the voltage of fine reference ladder 4-414 is a fixed ratio of the voltage for coarse reference ladder 4-408. A calibration is used to ensure that the voltage ratio is fixed between fine reference ladder 4-414 and coarse reference ladder 4-414. Accordingly, very small resistor segments that are used in coarse DAC ladder 604 do not need to be used in fine reference ladder 4-414. More details of the calibration of fine reference ladder 4-414 will be described below.

Example Implementation of ADC Architecture Using Multiple Track and Hold Stages

Figure 7:
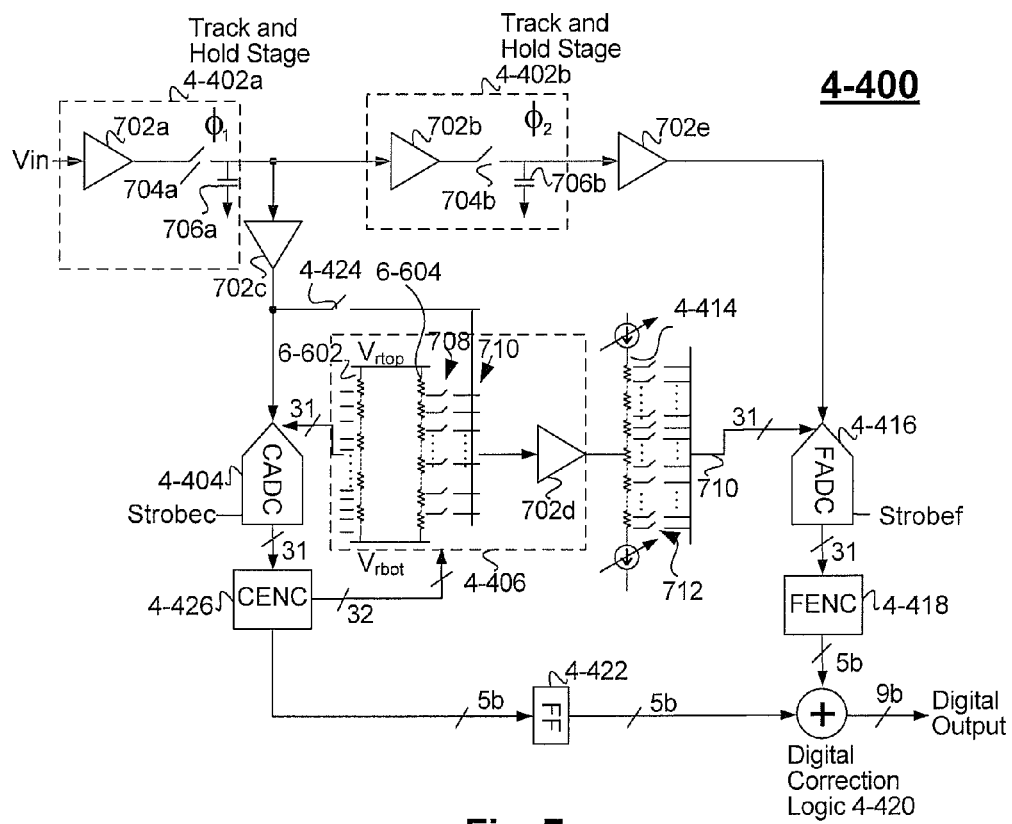
FIG. 7 depicts a more detailed example of the ADC architecture according to one embodiment.

FIG. 7 depicts a more detailed example of ADC architecture 4-400 according to one embodiment. A first track-and-hold stage 4-402a includes an amplifier 702a, a switch 704a, and a capacitor 706a. Although this implementation of track-and-hold stage 4-402a is described, other implementations may be appreciated. Capacitor 706a is used to store the input voltage. Switch 704a is toggled between the track stage and the hold stage. The switch may be closed to charge capacitor 706a and then opened when the voltage is stored.

A second track-and-hold stage includes an amplifier 702b, switch 704b, and capacitor 706b. Amplifier 702b is gain matched with amplifier 702c. The matching ensures that the input voltage that is being input into coarse ADC 4-404 is matched with the voltage being tracked and stored by track-and-hold stage 4-402b.

Coarse DAC 4-406 includes coarse ADC reference ladder 6-602 and coarse DAC ladder 6-604. Coarse DAC 4-406 and coarse DAC ladder 6-604 each include a plurality of unit resistors. 31 coarse taps of coarse ADC reference ladder 6-602 in between the unit resistors are provided to coarse ADC 4-404. However, any number of coarse taps may be used. In this case, architecture 400 may be a 9-bit resolution ADC.

Coarse ADC (CADC) 4-404 receives a clocking signal, strobec. At each clock cycle, coarse ADC 4-404 makes a coarse decision. For example, when a coarse reference is selected by coarse ADC 4-404, coarse encoder (CENC) 4-426 provides a control signal to switches 708 included in switch matrix 4-410 to close one of the switches corresponding to the coarse reference selected. In one embodiment, a 32-bit signal is sent to open or close switches 708.

The selected coarse reference is sent through a buffer 702d from coarse DAC ladder 6-604. A buffer 702e is gain matched with buffer 702d. This ensures that the input voltage into fine ADC 4-416 from buffer 702e is gain matched with the reference selected by coarse ADC 4-404.

A plurality of fine taps and a plurality of fine switches 712 are included in fine reference ladder 4-414. In one example, based on the signal received, different switches in fine reference ladder 4-414 are closed to send 31 fine references to fine ADC 4-416. Fine ADC 4-416 may also receive the input voltage from buffer 702e.

Fine ADC (FADC) 4-416 makes a fine decision at each clock cycle of a clocking signal, strobef. For example, fine ADC 4-416 outputs logic outputs from comparisons of the input voltage and the fine references. Fine encoder 4-418 uses the logic outputs to determine a second digital code. Digital correction logic 4-420 receives the second digital code and the first digital code through a flip-flop 4-422. The first digital code may be used to determine the 5 most significant bits for the digital output and the second digital code may be used to refine the 5 least significant bits of the first digital code. For example, digital correction logic 420 combines and error corrects the first digital code and second digital code into a 9-bit digital output.

Figure 1:
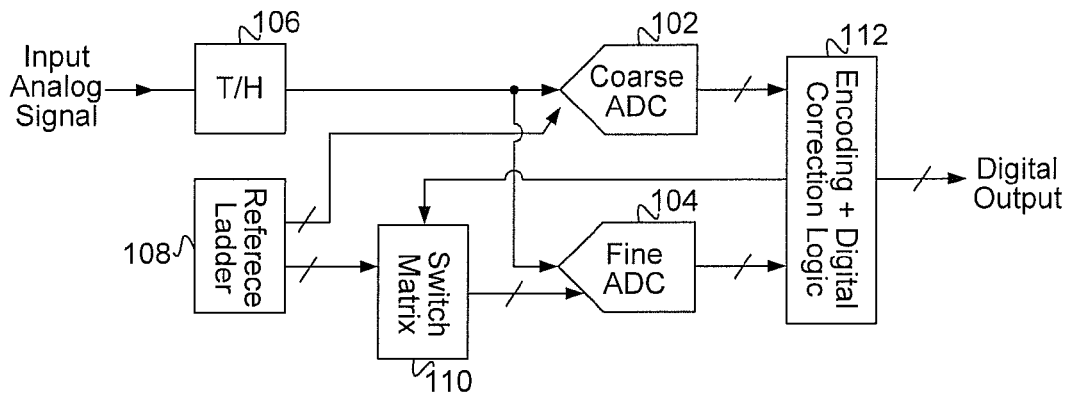
FIG. 1 depicts a conventional two-step subranging ADC architecture.
Figure 3:
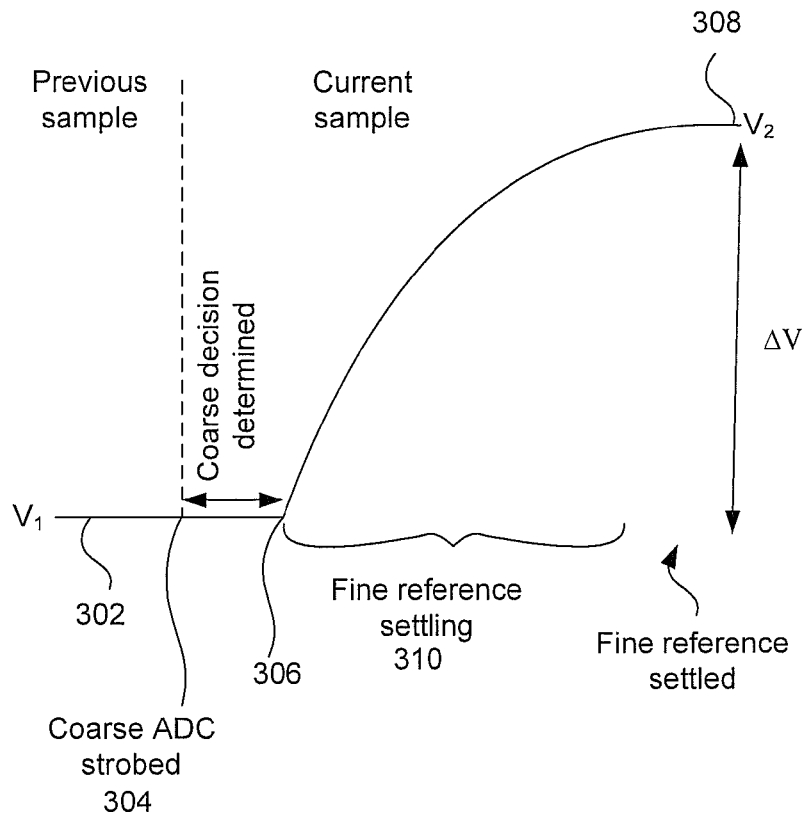
FIG. 3 depicts a waveform of a conventional method of precharging using the architecture.
Figure 2:
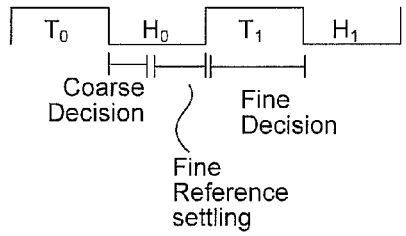
FIG. 2 shows a timing diagram for the conventional two-step subranging architecture.
Figure 8:
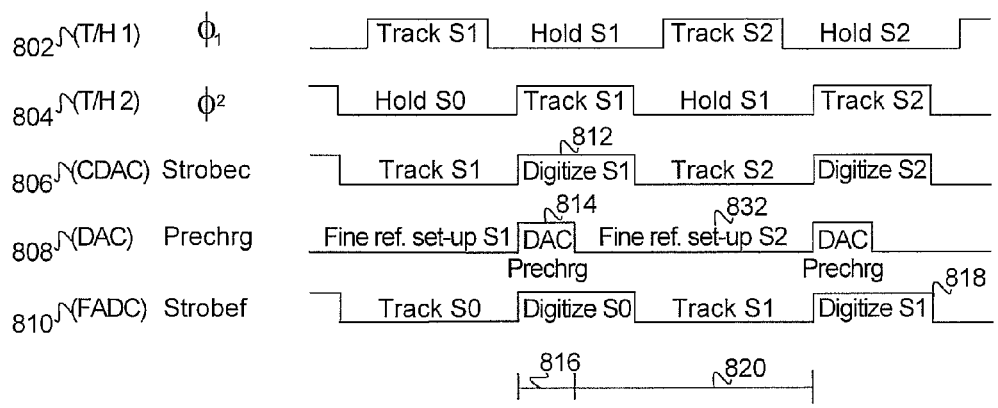
FIG. 8 depicts a timing diagram for the ADC architecture described in FIG. 7 according to one embodiment.

FIG. 8 depicts a timing diagram for architecture 4-400 described in FIG. 7 according to one embodiment. Because two track-and-hold stages 4-404a and 4-404b are used, additional time for reference settling is provided. Conventionally, as described in FIG. 3, the coarse decision, fine reference bit encoding, and fine reference settling are all are done in half of a clock cycle (T/2). However, in particular embodiments, this total time is extended by another half clock period ~T/2 to be approximately a full clock period before fine ADC 4-416 needs to start making a comparison.

At 802 and 804, the signals for first track-and-hold stage 4-404a and second track-and-hold stage 4-402b are shown. First track-and-hold stage 4-404a tracks and holds a sample for a clock period, T, and then second track-and-hold stage 4-402b tracks and holds the same sample for another clock period, T. For example, first track-and-hold stage 4-402a tracks and holds a new sample S1 and then second track-and-hold stage 4-402b tracks and holds the new sample. While first track and hold stage 4-402a is tracking the new sample S1, second track and hold stage 4-402b is holding a current sample S0. The delay in tracking and holding between first track-and-hold stage 4-402a and second track-and-hold stage 4-402b is approximately T/2.

At 806, 808, and 810, the signals for coarse ADC 4-404, coarse DAC 4-406, and fine ADC 4-416 are shown, respectively. Coarse ADC 4-404 makes a coarse decision at 812 for the sample S1. The fine references need to be set up after the coarse decision is made. That is, coarse DAC reference ladder 6-604 settles. Additionally, a precharge of the output of coarse DAC ladder 6-604 is performed at 814. A time period shown at 816 shows the time taken to make the coarse decision.

Fine ADC 4-416 then makes a fine decision for the sample S1 at 818. Thus, instead of determining the first digital code and the second digital code, respectively, within consecutive T/2 periods, the fine decision time is extended to another T/2 period. That is, the coarse decision determination starts in a first T/2 period, a second T/2 period passes, and the fine decision determination is started after the second T/2 period. As shown at 820, fine reference ladder 4-414 settles and makes the fine decision in a second time period. Fine ADC 4-416 has approximately a full clock period before fine ADC 4-416 has to start a comparison to determine the fine decision after the coarse decision determination starts. This allows the ADC conversion rate to be higher.

Architecture 4-400 is described in co-pending U.S. patent application Ser. No. 12/684,735 entitled "Two-Step Subranging ADC Architecture", filed Jan. 8, 2010, the contents of which is incorporated herein in its entirety for all purposes.

Calibration of Fine Reference Ladder

Figure 9:
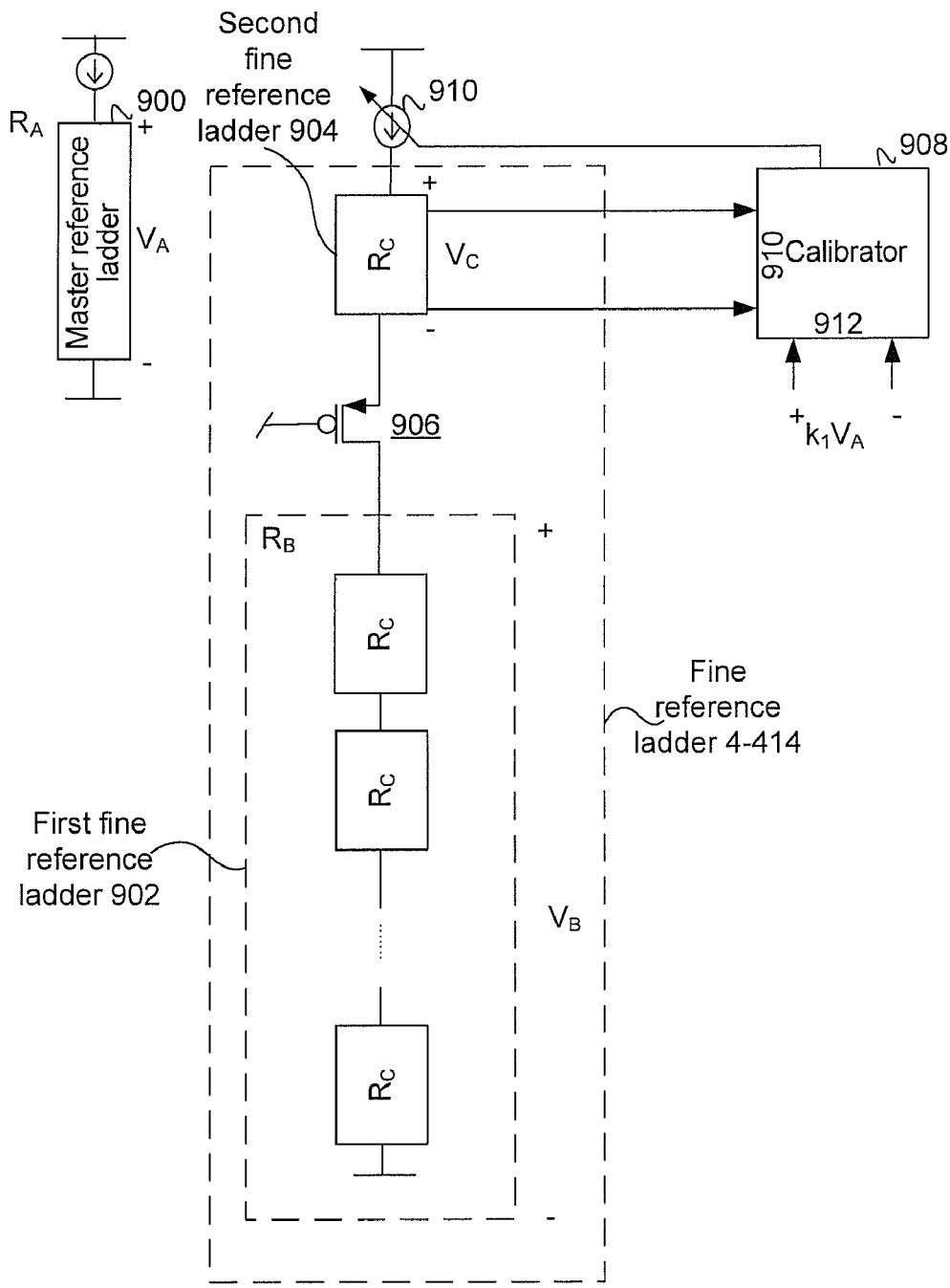
FIG. 9 depicts an example of calibration of reference ladders according to one embodiment.

FIG. 9 depicts an example of calibration of reference ladders according to one embodiment. The calibration is described with respect to coarse reference ladder 4-408 and fine reference ladder 4-414; however, it will be understood that the calibration described herein may be used with respect to other designs. For example, other designs that require multiple reference ladders may use the calibration described. Also, although reference ladders that provide references are discussed, the calibration may be used on any resistor ladders.

In one embodiment, a master reference ladder 900 is part of coarse reference ladder 4-408. For example, master reference ladder may be a reference segment (unit resistor) that is selected as the subrange by coarse ADC 4-404. Master reference ladder 900 is a precise ladder. For example, master reference ladder 900 is built using larger valued unit resistors, $R_A$, where a voltage, $V_A$, is stable across the unit resistor $R_A$.

Fine reference ladder 4-414 includes a first fine reference ladder 902 and a second fine reference ladder 904. Second fine reference ladder 904 may be a separate part of or included in fine reference ladder 4-414. Second fine reference ladder 904 includes a unit resistor, $R_C$, and first fine reference ladder 902 includes a unit resistor, $R_B$. Unit resistor $R_B$ includes one or more unit resistors $R_C$.

Second fine reference ladder 904 is separated from first fine reference ladder 902 using a buffer component 906. For example, buffer component 906 may be one or more cascode devices. Buffer 906 attenuates noise from a signal path that is from coarse reference ladder 4-408 to first fine reference ladder 902. Because first fine reference ladder 902 is in the signal path, it may produce noise. Buffer 906 provides a high-impedance shielding from the signal path that may filter or attenuate the noise from first fine reference ladder 902.

Dynamic events occur at first fine reference ladder 902 that may cause the noise. For example, the voltage $V_B$ may be dynamically changing. In one example, as different subranges are selected in fine reference ladder 4-414, different voltage levels are across first fine reference ladder 902. In contrast, the voltage $V_C$ is not changing and second reference ladder 904 is quiet compared to first reference ladder 902. Because of the shielding from buffer 906, the current through second fine reference ladder 904 is also almost quiescent and is isolated from dynamic events at first fine reference ladder 902 because any noise from the events is absorbed by buffer 906.

A calibrator 908 performs a calibration of voltages across second fine reference ladder 904 and master reference ladder 900. The quiet voltage across second fine reference ladder 904 can also be used to calibrate the voltage across first fine reference ladder 902. Using a quiet voltage instead of a noisy voltage provides a more accurate calibration. In one embodiment, calibrator 908 uses a low-offset, low speed calibration loop in the background to perform the calibration.

Calibrator 908 senses the voltage $V_C$ from second fine reference ladder 904 at a sense port 910. Also, calibrator 908 senses the voltage across the whole or a segment of first reference ladder 4-408 at a reference port 912. The voltage $V_A$ is a multiple $k_1$ of $V_C$, where $k_1$ is a constant. Calibrator 908 adjusts the current to adjust $V_C$ to be multiple $k_1$ of $V_A$. For example, the current may be adjusted using a current source 910.

First fine reference ladder 902 and second fine reference ladder 904 are matched together using a fixed ratio. For example, first reference ladder 902 is built using units of second fine reference ladder 904, or vice versa. If a unit resistor, $R_C$, is used in second fine reference ladder 904, first fine reference ladder 902 is built using multiple unit resistors of $R_C$.

By using multiple units of $R_C$, the voltage $V_B$ may be a fixed ratio of $V_A$. For example, the voltage $V_C$ is:

$$V_C = k_1 V_A$$

If first fine reference ladder 902 and second fine reference ladder 904 having good matching, then:

$$V_B = k_2 V_C = k_2 k_1 V_A = k_3 V_A.$$

Thus, $V_B$ is a fixed ratio of $V_A$, where $k_1$, $k_2$, and $k_3$ are constants.

Accordingly, first fine reference ladder 902 may be matched to coarse reference ladder 4-408 through the calibration. First fine reference ladder 902 and second fine reference ladder 904 may be implemented using different orientation and size resistors from coarse reference ladder 4-408. Also, matching is kept over all corners and long term drifts using background calibration without disturbing the signal path or having calibration affected by the signal path.

Figure 10:
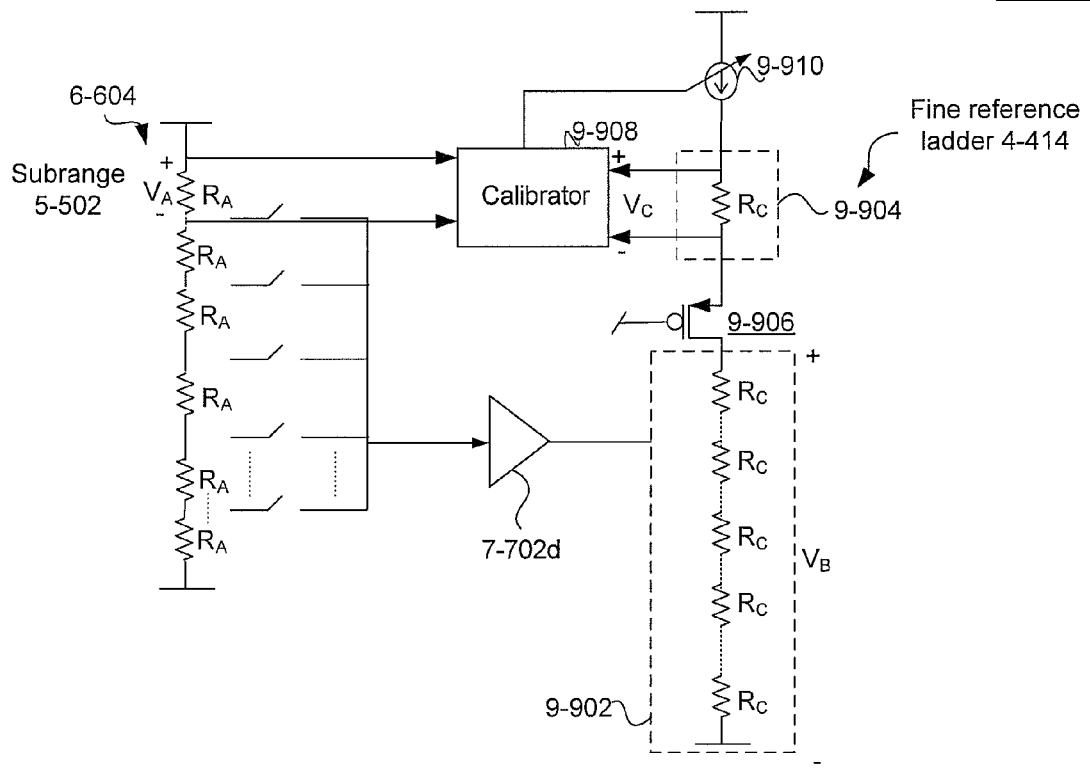
FIG. 10 shows a more detailed example of the ADC architecture according to one embodiment.

FIG. 10 shows a more detailed example of architecture 4-400 according to one embodiment. As shown, coarse DAC ladder 6-604 includes a plurality of unit resistors $R_A$. Second fine reference ladder 9-904 includes a unit resistor $R_C$ and first fine reference ladder 9-902 includes a plurality of unit resistors $R_C$. As discussed above, coarse ADC 4-404 receives an input voltage and selects a coarse reference. A subrange 5-502 in coarse DAC ladder 6-604 is selected to send the coarse reference to fine reference ladder 4-414 through buffer 7-702d. Buffer component 7-906 is coupled to a circuit such that it attenuates noise from first fine reference ladder 9-902. A current based on a voltage level of the coarse reference is sent to buffer 7-702. The voltage $V_A$ is a voltage drop across a unit resistor of coarse DAC ladder 6-604. The voltage $V_B$ is matched to a fixed ratio of the selected voltage $V_A$ using the calibration.

The voltage $V_A$ is sent to calibrator 9-908. Calibrator 9-908 also senses the voltage $V_C$ across second fine reference ladder 9-904. Calibrator 9-908 calibrates the current across fine reference ladder 4-414 using current source 9-910. As discussed above, the voltage $V_B$ is calibrated to a multiple $V_A$.

Figure 11:
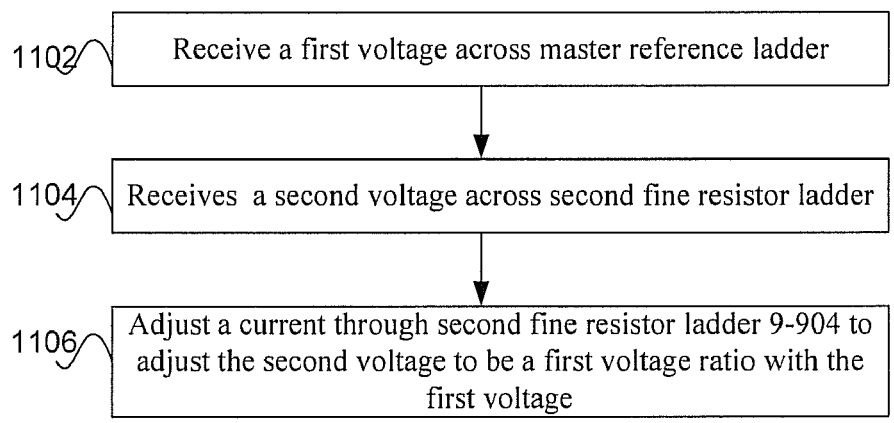
FIG. 11 depicts a simplified flowchart of a method for calibrating reference ladders according to one embodiment.

FIG. 11 depicts a simplified flowchart 1100 of a method for calibrating reference ladders according to one embodiment. At 1102, calibrator 9-908 receives a first voltage across master reference ladder 9-900. At 1104, calibrator 9-908 receives a second voltage across second fine reference ladder 9-904. The second voltage being received is buffered from disturbances in a third reference ladder.

At 1106, calibrator 9-908 adjusts a current through second fine reference ladder 9-904 to adjust the second voltage to be a first voltage ratio with the first voltage. The adjustment of the current adjusts a third voltage across first fine reference ladder 9-902 to be a second voltage ratio of the first voltage to the third voltage.

The use of the calibration is described in co-pending U.S. patent application Ser. No. 12/684,773 entitled "Current Sensing and Background Calibration to Match Two Resistor Ladders", filed concurrently, the contents of which is incorporated herein in its entirety for all purposes.

Reference Precharge

Referring back to FIG. 4, in one embodiment, a pre-charge of the voltage level at the output of switch matrix 410 is provided. The voltage level is pre-charged to a level of the input voltage. This allows the movement of the voltage at the output of switch matrix 410 to be performed more quickly. For example, the previous voltage level at the output of switch matrix 410 may be the voltage of the last analog input sample. The voltage level needs to be moved from the previous voltage level to the coarse reference selected by coarse ADC 404. For example, the coarse reference selected by coarse ADC 404 is the input voltage plus a quantization error $E_q$. The quantization error $E_q$ is the error from the closest digital code that approximates the input voltage.

A time period is taken where coarse ADC 404 is making the coarse decision. During this time period, the voltage level at the output of switch matrix 410 may be pre-charged to the input voltage ($V_{in}$). When the coarse decision is made, the voltage only needs to be changed to $V_{in}+E_q$. For example, the selected coarse reference is a voltage that is for a subrange that includes input voltage. Thus, if it is known the output of switch matrix 410 will be around $V_{in}+E_q$, the output of switch matrix 410 may be pre-charged to the input voltage $V_{in}$. The adjusting of the input voltage may be performed faster because adjusting an $E_q$ amount is a much smaller adjustment than from the previous sample's voltage level.

As shown in FIG. 4, a switch 424 is provided to allow the precharge of the output of switch matrix 4-410. Switch 424 may be closed to precharge the output of switch matrix 410 while coarse ADC 404 is making the coarse decision. When the coarse decision is made, switch 424 is opened to allow the output of switch matrix 410 to settle to $V_{in}+E_q$. In this case, a switch in switch matrix 410 is closed and the coarse reference is sent to buffer 4-412.

FIG. 7 also shows the precharge according to one embodiment. As shown, switch 4-424 is used to precharge output lines of coarse DAC 6-604. When coarse ADC is making the coarse decision, switch 4-424 may be closed and switches 708 may be open. This allows input lines 710 to be precharged to the input voltage $V_{in}$. In one embodiment, all input lines 710 are precharged. Thus, when the coarse reference is selected, the selected input line 710 is precharged. When the coarse decision is made, a switch 708 is closed to send the coarse reference to fine reference ladder 4-414. Also, switch 4-424 is opened to allow the selected input line 710 to settle to $V_{in}+E_q$.

Figure 12:
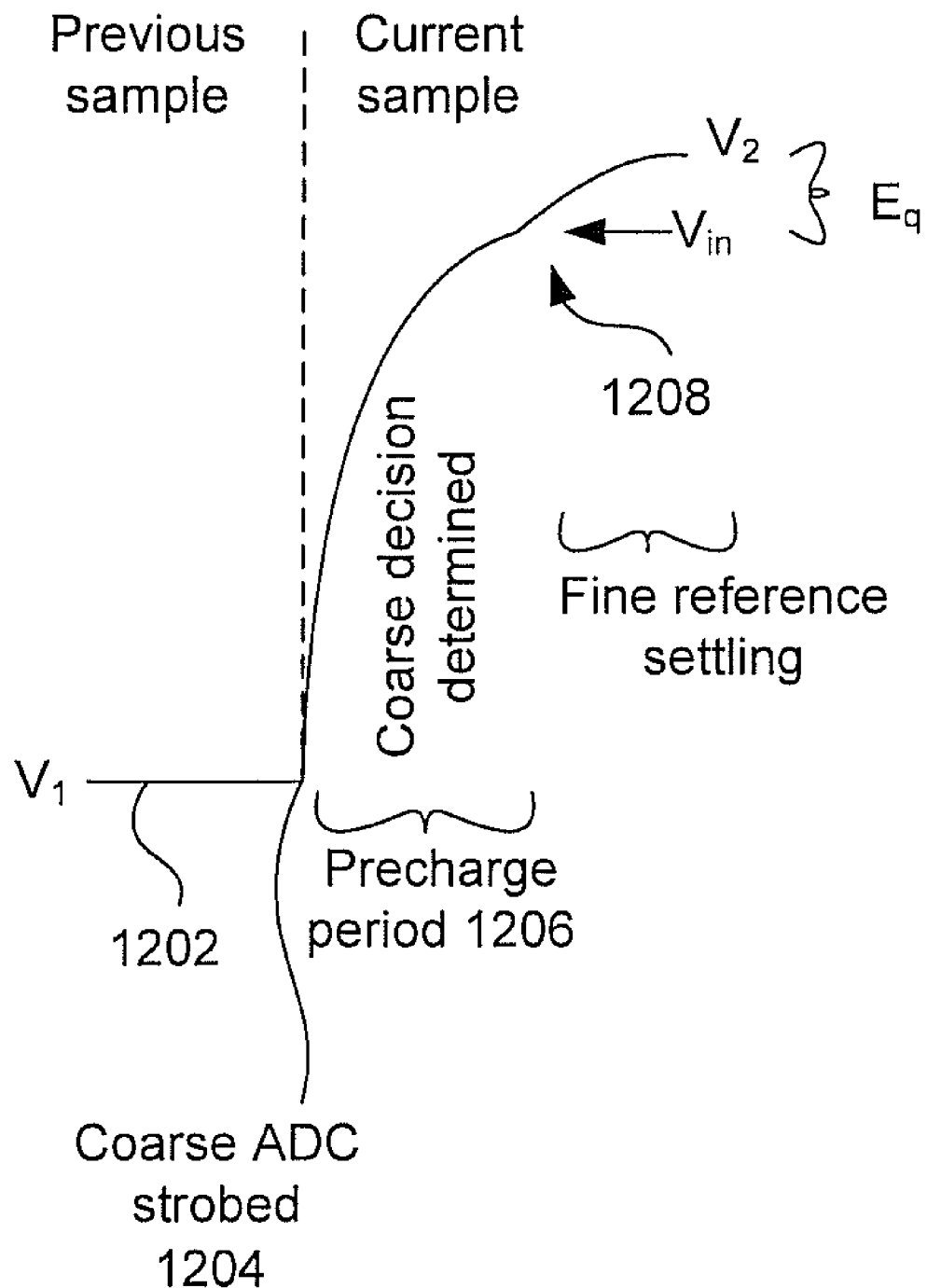
FIG. 12 depicts a waveform showing the pre-charge of an output of a switch matrix according to one embodiment.

FIG. 12 depicts a waveform showing the pre-charge of an output of switch matrix 4-410 according to one embodiment. At 1202, the voltage at the output of switch matrix 4-410 is $V_1$. This is the voltage of the previous input voltage sample. At 1204, coarse ADC 4-404 is strobed. At this point, coarse ADC 4-404 may start to make a coarse decision. For example, at 1206, coarse ADC 4-404 performs a comparison of the input voltage and the plurality of coarse references. At 1208, the first digital code is determined based on the comparison. The first digital code is used to select a switch in switch matrix 4-410.

The output of switch matrix 4-410 is pre-charged during a period at 1206. When a switch is selected, instead of the voltage at the output of switch matrix 4-410 being at $V_1$, the voltage is substantially around $V_{in}$. The voltage then needs to settle at the coarse reference of the input voltage $V_{in}$ plus the coarse quantization error $E_q$.

Figure 13:
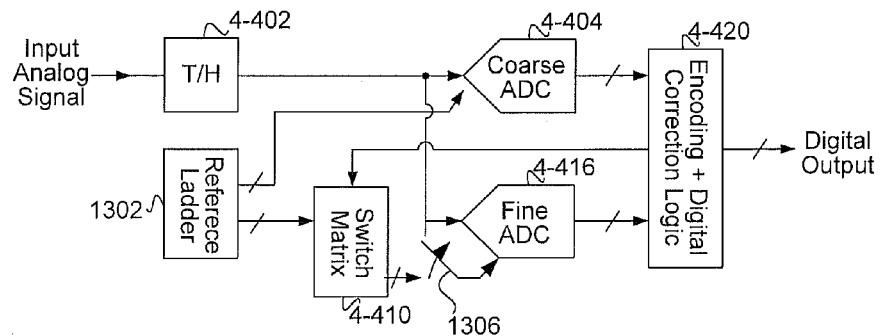
FIG. 13 depicts another implementation of a two-step subranging ADC architecture according to one embodiment.

FIG. 13 depicts another implementation of a two-step subranging ADC architecture 1300 according to one embodiment. In one embodiment, a pre-charge of the voltage level at the output of switch matrix 4-410 is provided. The voltage level is pre-charged to a level of the input voltage $V_{in}$. This allows the movement of the voltage at the output of switch matrix 4-410 to be performed more quickly.

A switch 1306 is included to provide the precharge. For example, switch 1306 is coupled to the input voltage when coarse ADC 4-404 is making the coarse decision. When the coarse decision is made, switch 1306 is coupled to switch matrix 4-410. The coarse decision may have caused multiple switches in switch matrix 4-410 to be closed to provide the fine references to fine ADC 4-416. The fine references are within the voltage of the input voltage $V_{in}$ plus a quantization error $E_q+\Delta V$. The input voltage $V_{in}$ plus a quantization error $E_q$ is the voltage level of the coarse reference. The fine references include multiple voltage levels that are within the voltage range of $\Delta V$. Because the output of switch matrix 4-410 has been precharged to the input voltage, the settling time to move the input voltage to the voltage levels of the fine references is reduced.

Figure 14:
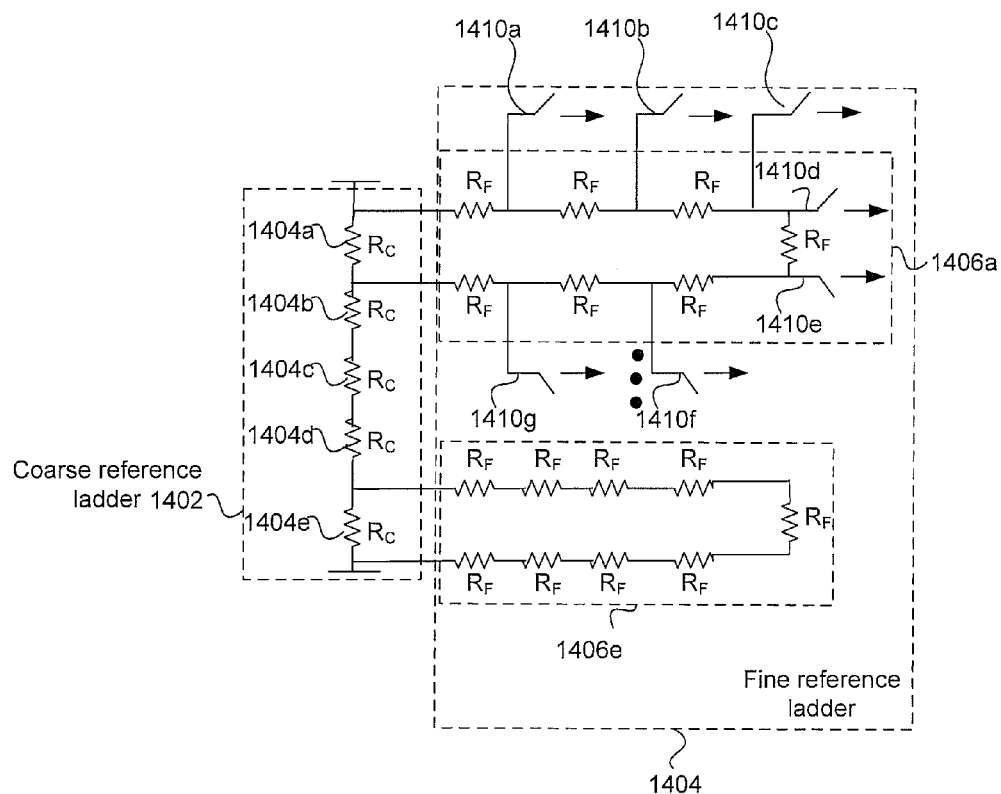
FIG. 14 depicts a more detailed example of reference ladder and switch matrix according to one embodiment.

FIG. 14 depicts a more detailed example of reference ladder 13-1302 and switch matrix 4-410 according to one embodiment. A coarse reference ladder 1402 includes a plurality of resistor segments $R_C$ (e.g., unit resistors). A fine resistor ladder 1404 includes a plurality of fine segments 1406 that correspond to a subrange of voltages. For example, each coarse reference is associated with a fine segment 1406. Also, each fine segment 1406 includes a plurality of resistor segments $R_F$ (e.g., unit resistors).

A plurality of fine reference taps 1410*a-g* (each fine segment includes reference taps 1410 (not shown)) are used to tap fine reference ladder 1406. Different fine references (e.g., voltage levels) are provided to fine ADC 4-416 using taps 1410. For each subrange, the voltage across a corresponding fine segment 1406 of fine reference ladder 1404 is the same as the subrange of coarse reference ladder 1402. For example, fine segment 1406*a* has the same voltage across it as coarse reference ladder segment 1404*a*.

Coarse ADC 4-404 selects a subrange that is determined to include a voltage equal to the input voltage. For example, if the input voltage falls within a subrange corresponding to coarse reference ladder segment 1404*a*, fine reference ladder segment 1406*a* is selected. The first digital code is used to select switches that are closed to connect taps 1410 to fine ADC 4-416. Fine ADC 4-416 uses the different voltage levels of taps 1410 to determine a fine reference that is closest in voltage to the input voltage. The voltage levels of taps 1410 need to settle from a voltage level of a previous input voltage to the voltage level of the selected coarse reference. Thus, if input lines for taps 1410 are pre-charged to the current input voltage, less time is taken to settle to the coarse reference because the current input voltage is closer to the coarse reference.

Figure 15:
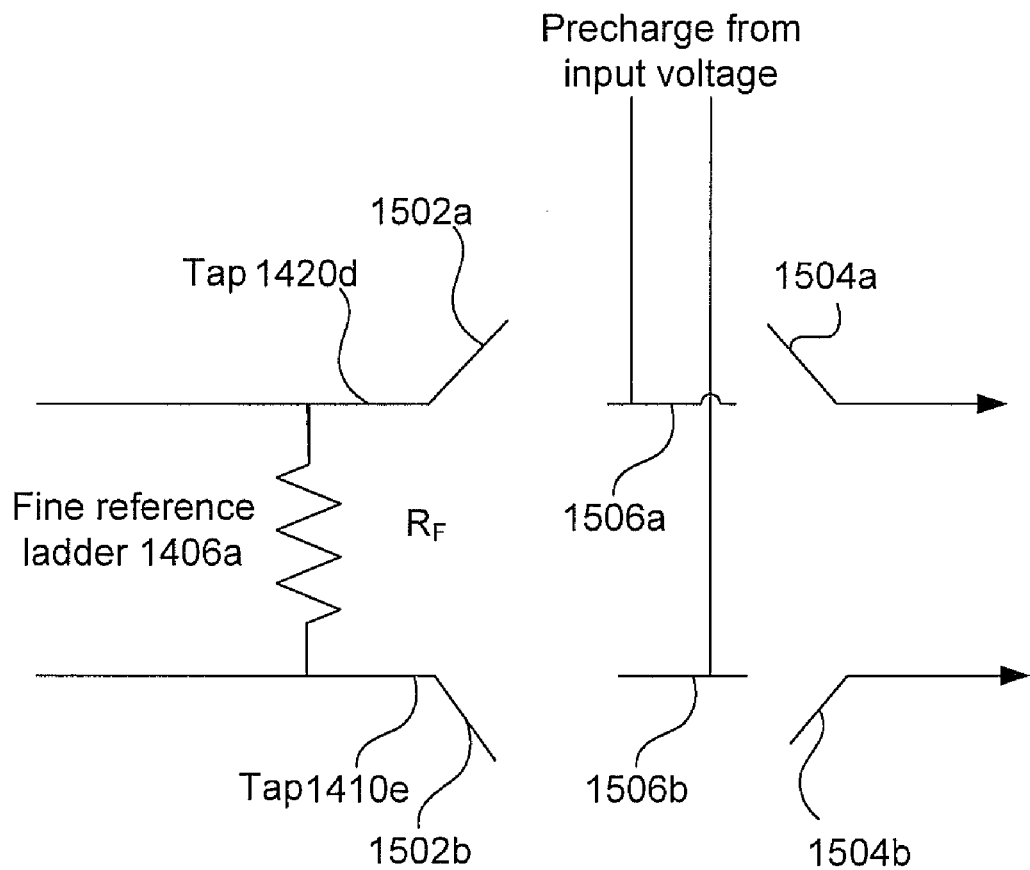
FIG. 15 shows a more detailed embodiment of FIG. 14 according to one embodiment.

FIG. 15 shows a more detailed embodiment of FIG. 14 according to one embodiment. FIG. 15 focuses on two taps 14-1410*d*/14-1410*e* to fine reference ladder 14-1406*a*. Other taps 14-1410 include similar structure. Taps 14-1410*d*/14-1410*e* include a first switch 1502 and a second switch 1504. When first switch 1502*a*/1502*b* are open and a second switch 1504*a*/1504*b* may or may not be open, input lines 1406*a*/1406*b* are pre-charged to the input voltage.

Taps 14-1410 provide different voltage levels to fine ADC 4-416. The fine reference from tap 14-1410*d* is different voltage level from the fine reference from tap 14-1410*e*. Fine reference ladder 14-1406*a* needs to settle at these different voltage levels from the previous sample's reference voltage levels. The voltage levels of the fine references are a voltage $\Delta V$ within the pre-charged input voltage. Thus, although fine reference ladder 1406*a* needs to settle, the voltage level at each tap 14-1410*d* and 14-1410*e* needs to only changed within the voltage $\Delta V$ from the pre-charged voltage $V_{in}$. The voltage $\Delta V$ is less of a change from a previous sample's voltage level.

Although FIG. 15 shows input lines 1506 for a single subrange being pre-charged, it will be understood that all input lines for all subranges may be pre-charged prior to coarse ADC 4-404 making its coarse decision. When switches 1502 and 1504 are selected for a subrange, input lines 1406 for this subrange are already pre-charged. The other precharged input lines 1506 are not used.

Although a second set of switches 1504 may need to be added to pre-charge input lines 1406, the reduced time for fine reference ladder 1406 to settle is advantageous. For example, slew rate would be greatly improved to drive larger input loads from the comparators of fine ADC 4-416. Also, reference settling speed is improved, which alleviates a speed bottleneck.

Method Using Particular Embodiments

Figure 16:
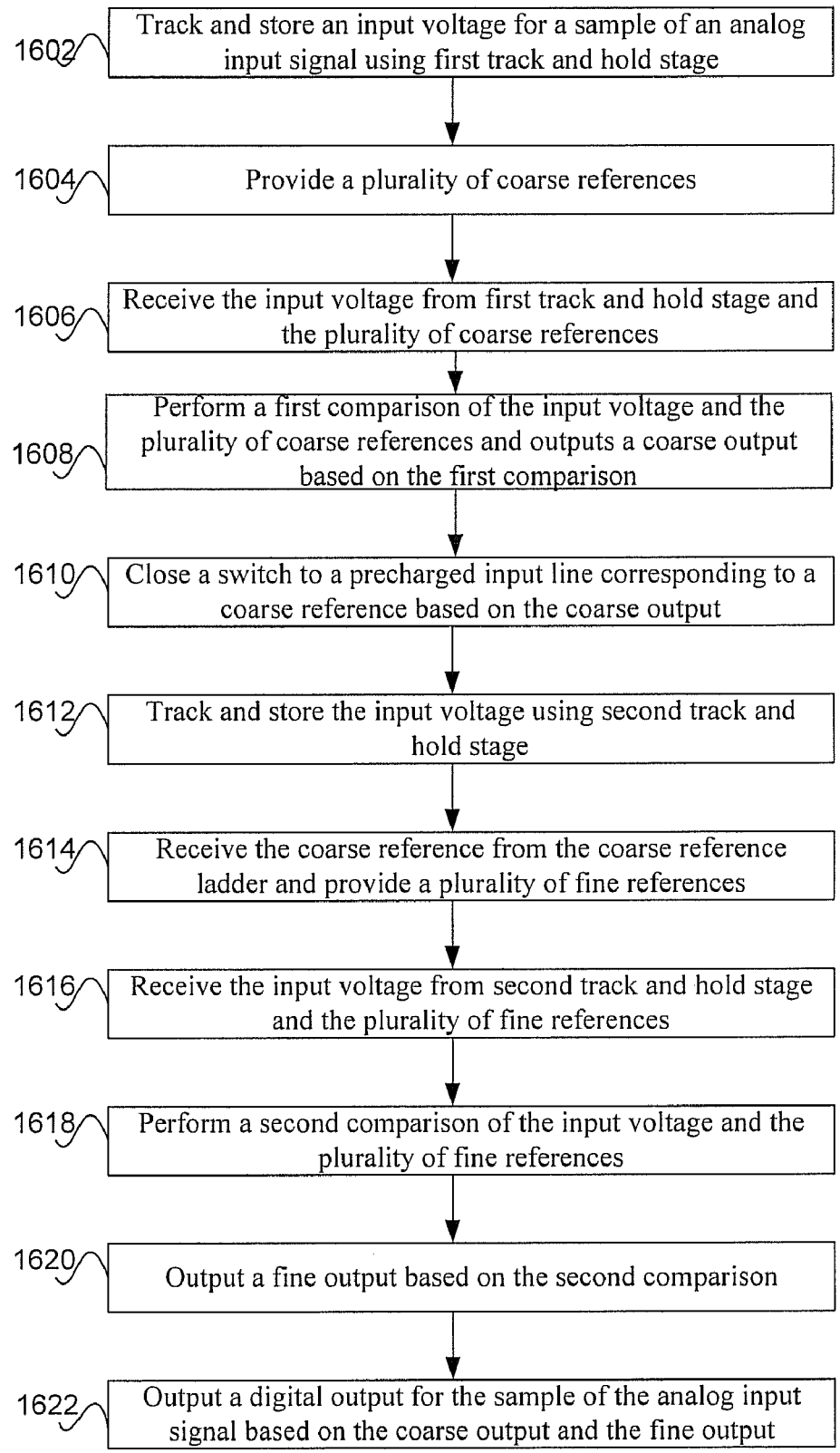
FIG. 16 depicts a simplified flowchart of a method for converting an analog input signal to a digital output signal according to one embodiment.

FIG. 16 depicts a simplified flowchart 1600 of a method for converting an analog input signal to a digital output signal according to one embodiment. At 1602, first track and hold stage 4-402*a* tracks and stores an input voltage for a sample of an analog input signal. At 1604, coarse reference ladder 4-408 provides a plurality of coarse references. In one embodiment, coarse reference ladder 4-408 includes first coarse ADC reference ladder 6-602 and second coarse reference ladder 6-604.

At 1606, coarse ADC 4-404 receives the input voltage from first track and hold stage 4-402*a* and the plurality of coarse references. At 1608, coarse ADC 4-404 performs a first comparison of the input voltage and the plurality of coarse references and outputs a coarse output based on the first comparison. At 1610, switch matrix 4-410 closes a switch corresponding to a coarse reference based on the coarse output. An input line has been precharged to the input voltage.

At 1612, second track and hold stage 402*b* tracks and stores the input voltage. At 1614, fine reference ladder 4-414 receives the coarse reference from the coarse reference ladder and provides a plurality of fine references. The plurality of fine references are determined based on the coarse reference. At 1616, fine ADC 4-416 receives the input voltage from second track and hold stage 4-402*b* and the plurality of fine references. At 1618, fine ADC 4-416 performs a second comparison of the input voltage and the plurality of fine references. At 1620, fine ADC 4-416 outputs a fine output based on the second comparison. At 1622, a digital output is output for the sample of the analog input signal based on the coarse output and the fine output.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:
1. An apparatus comprising:
   a coarse reference ladder providing a plurality of coarse references;
   a coarse analog-to-digital converter (ADC) configured to receive an input voltage from a sample of an analog input signal, wherein the coarse ADC is configured to perform a first comparison of the input voltage and the plurality of coarse references and output a coarse output;
   a switch matrix including a plurality of switches, the switch matrix configured to close a switch based on the coarse output, the switch corresponding to a coarse reference;
   an input line coupled to the switch matrix, wherein the input line is precharged to the input voltage and then settles from the precharged input voltage to a voltage level of the coarse reference;
   a fine reference ladder providing a plurality of fine references based on the coarse reference, wherein the precharged input line is in between the switch matrix and the fine reference ladder;

a fine ADC configured to receive the input voltage and perform a second comparison of the input voltage and the plurality of fine references and output a fine output; and logic configured to output a digital output for the sample of the analog input signal based on the coarse output and the fine output.

2. The apparatus of claim 1, wherein the coarse reference ladder comprises:

a first coarse reference ladder including a plurality of first taps to provide the plurality of coarse references; and a second coarse reference ladder including a plurality of second taps to provide the plurality of coarse references, wherein the second coarse reference ladder is coupled to the input line through a second tap of the plurality of second taps.

3. The apparatus of claim 2, wherein the second coarse reference ladder provides the coarse reference based on the switch closed, wherein the input line settles from the precharged input voltage to the coarse reference provided by the second coarse reference ladder.

4. The apparatus of claim 1, further comprising a buffer comprising an input coupled to the input line and an output coupled to the fine reference ladder, the buffer configured to provide the coarse reference to the fine reference ladder.

5. The apparatus of claim 1, wherein the switch matrix comprises a plurality of switches, the plurality of switches being open for a time period when the coarse ADC is performing the first comparison, wherein the switch is closed when the coarse ADC outputs the coarse output, the time period being when the input line is precharged.

6. The apparatus of claim 5, further comprising a precharge switch, the precharge switch being closed for the time period when the coarse ADC is performing the first comparison, wherein the precharge switch is open when the coarse ADC outputs the coarse output, the precharge switch allowing the input line to be precharged.

7. The apparatus of claim 6, wherein the precharge switch when closed couples the input line to the input voltage.

8. The apparatus of claim 1, further comprising a plurality of input lines, the plurality of input lines being precharged to the input voltage.

9. The apparatus of claim 8, wherein the switch matrix comprises:

a plurality of first sets of switches on a first side of the plurality of input lines; and a plurality of second sets of switches on a second side of the plurality of input lines.

10. The apparatus of claim 9, wherein the plurality of first sets of switches and a plurality of second sets of switches are open when the coarse ADC is performing the first comparison, wherein a first set of switches and a second set of switches are closed after the coarse decision is determined.

11. The apparatus of claim 8, wherein the first sets and second sets of switches are open when the plurality of input lines are being precharged.

12. The apparatus of claim 11, wherein a first set of switches and a second set of switches are closed based on the coarse reference selected.

13. The apparatus of claim 1, further comprising a first track and hold stage configured to track and store the input voltage for the sample of the analog input signal, wherein the input line is precharged from the stored input voltage from the first track and hold stage.

14. A method comprising:

providing a plurality of coarse references;

receiving an input voltage from a sample of an analog input signal;

performing a first comparison of the input voltage and the plurality of coarse references;

precharging an input line to the input voltage;

outputting a coarse output;

closing a switch based on the coarse output, the switch corresponding to a coarse reference, wherein the input line is located between the switch and a fine reference ladder, the input line settling from the precharged input voltage to a voltage level of the coarse reference;

providing, from the fine reference ladder, a plurality of fine references based on the coarse reference;

receiving the input voltage;

performing a second comparison of the input voltage and the plurality of fine references and outputting a fine output; and outputting a digital output for the sample of the analog input signal based on the coarse output and the fine output.

15. The method of claim 14, further comprising tracking and storing the input voltage for the sample of the analog input signal, wherein the input line is precharged from the stored input voltage from the first track and hold stage.

16. The method of claim 14, further comprising:

providing the plurality of coarse references through a plurality of first taps; and providing the plurality of coarse references through a plurality of second taps, wherein the coarse reference is provided through the precharged input line through a second tap.

17. The method of claim 16, further comprising providing the coarse reference through the closed switch to the input line.

18. The method of claim 14, further comprising precharging a plurality of input lines to the input voltage.

19. The method of claim 14, further comprising closing a second switch to allow the input line to settle from the precharged input voltage to the voltage level of the coarse reference.

20. The method of claim 14, further comprising providing the coarse reference to the fine reference ladder through a buffer.

* * * * *

UNITED STATES PATENT AND TRADEMARK OFFICE
CERTIFICATE OF CORRECTION

PATENT NO. : 8,049,652 B2
APPLICATION NO. : 12/684760
DATED : November 1, 2011
INVENTOR(S) : Kenneth Thet Zin Oo Page 1 of 1

It is certified that error appears in the above-identified patent and that said Letters Patent is hereby corrected as shown below:

In FIG. 8, at 806, "CDAC" should be "CADC".
In FIG. 8, in the waveform shown at 808, "Fine ref. set-up S1" should be "Fine ref. set-up S0" and "Fine ref. set-up S2" should be "Fine ref. set-up S1".

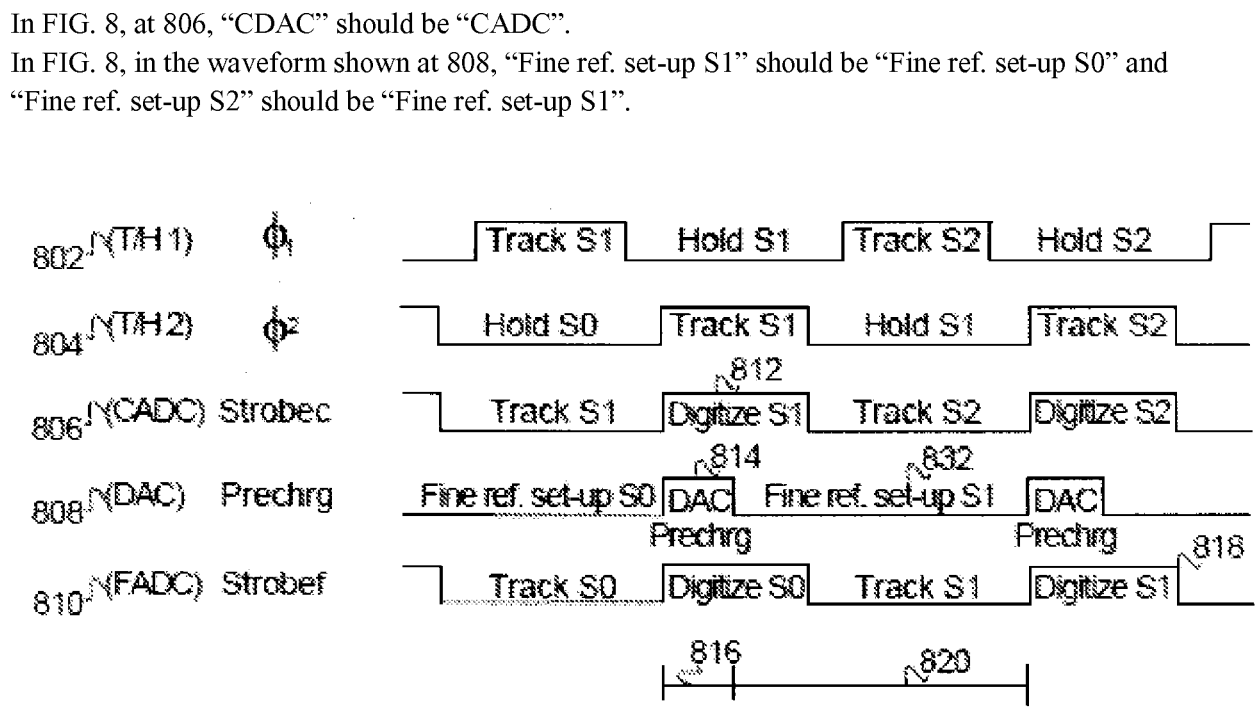

Fig. 8

Signed and Sealed this
Thirteenth Day of March, 2012

David J. Kappos
*Director of the United States Patent and Trademark Office*